Figure 1:
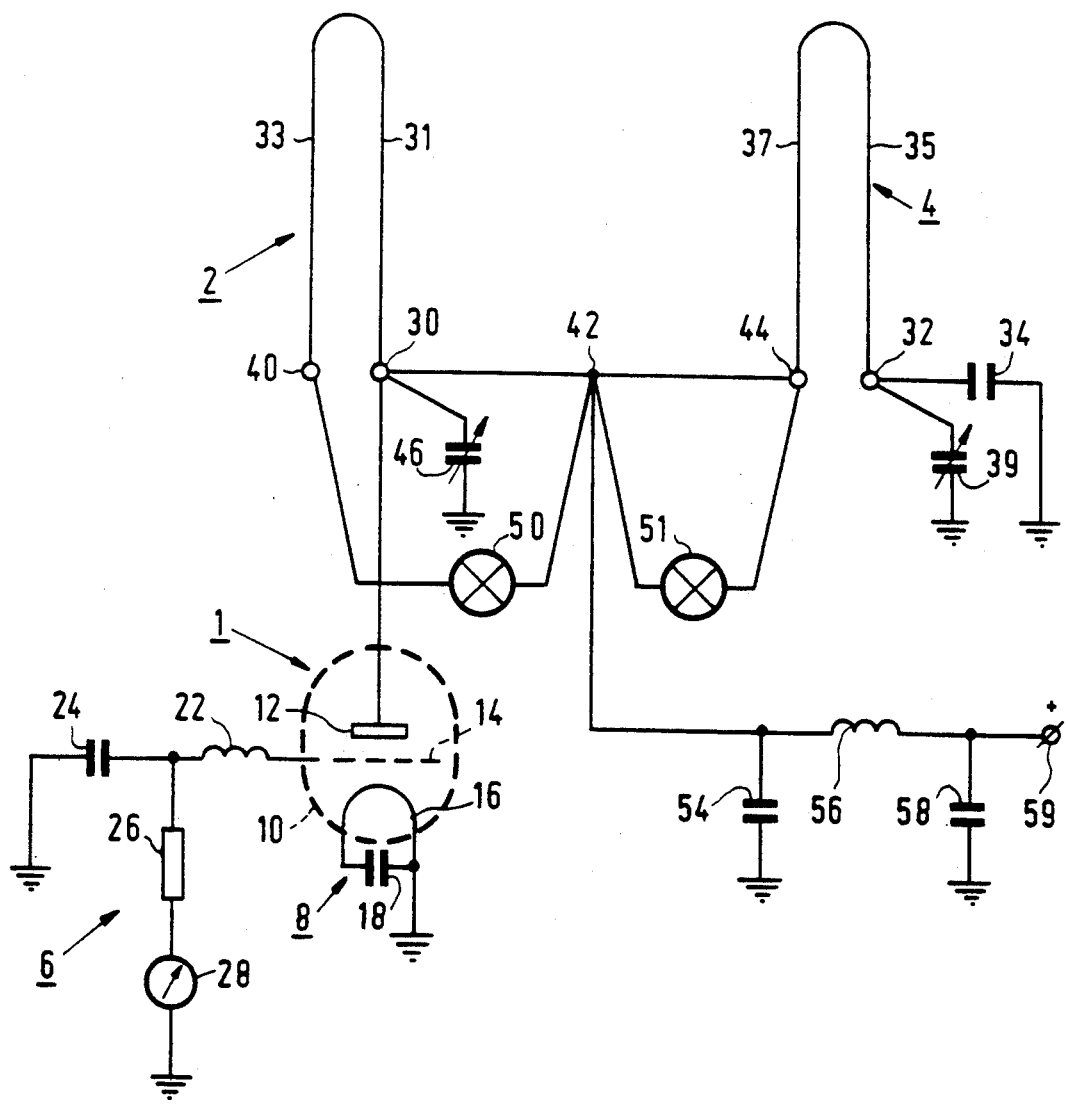

United States Patent [19]
Durr

[11] Patent Number: 5,180,949
[45] Date of Patent: Jan. 19, 1993

[54] PLASMA GENERATOR
[75] Inventor: René C. Durr, Albertville, France
[73] Assignee: U.S. Philips Corp., New York, N.Y.
[21] Appl. No.: 679,974
[22] Filed: Apr. 3, 1991
[30] Foreign Application Priority Data
  Apr. 6, 1990 [NL] Netherlands .................. 9000809
[51] Int. Cl.[5] .................................. H05H 1/46
[52] U.S. Cl. .................. 315/111.51; 315/111.21; 313/231.31; 356/316; 331/96
[58] Field of Search ............ 315/111.21, 111.51, 315/248; 313/231.31; 356/316; 331/96, 99

[56] References Cited
U.S. PATENT DOCUMENTS

| | | | |
|---|---|---|---|
| 2,086,335 | 7/1937 | Posthumus | 331/99 X |
| 2,573,517 | 10/1951 | Van Weed | 331/99 |
| 2,575,702 | 11/1951 | Baker | 331/99 |
| 2,589,477 | 3/1952 | Corporon | 331/99 X |
| 2,607,895 | 8/1952 | Bradley et al. | 331/99 X |
| 3,958,883 | 5/1976 | Turner | 315/111.51 X |
| 4,337,415 | 6/1982 | Dürr | 315/111.51 |
| 4,629,940 | 12/1986 | Gagne et al. | 315/111.51 |

Primary Examiner—Eugene R. LaRoche
Assistant Examiner—Do Hyun Yoo
Attorney, Agent, or Firm—William L. Botjer

[57] ABSTRACT

In a plasma generator for high-frequency supply of an induction coil containing a plasma of an aerosol with a substance to be analyzed, quarter-wave conductors of a quarter-wave resonant system are incorporated in the apparatus after having been divided and folded, which provides a significant saving in space. Added to the conductors are electric auxiliary circuitry for balancing the resonant system and for matching the frequency to a filled induction coil. The conduction coil is capable of up and down movement in a disturbance-free manner, the coil always being maintained at zero potential.

9 Claims, 2 Drawing Sheets

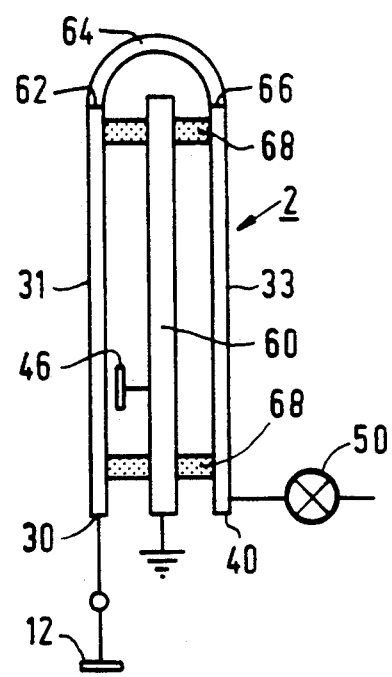
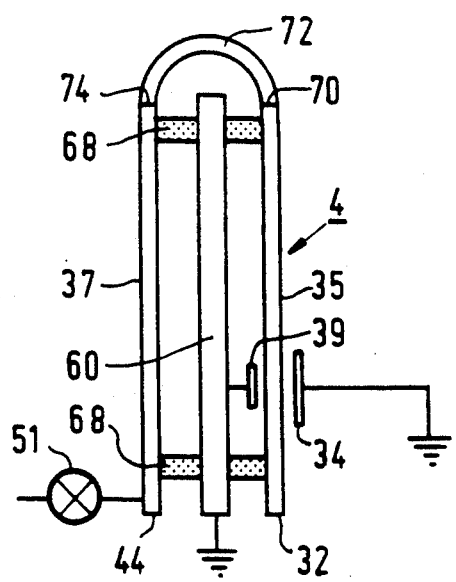
FIG.2  FIG.3
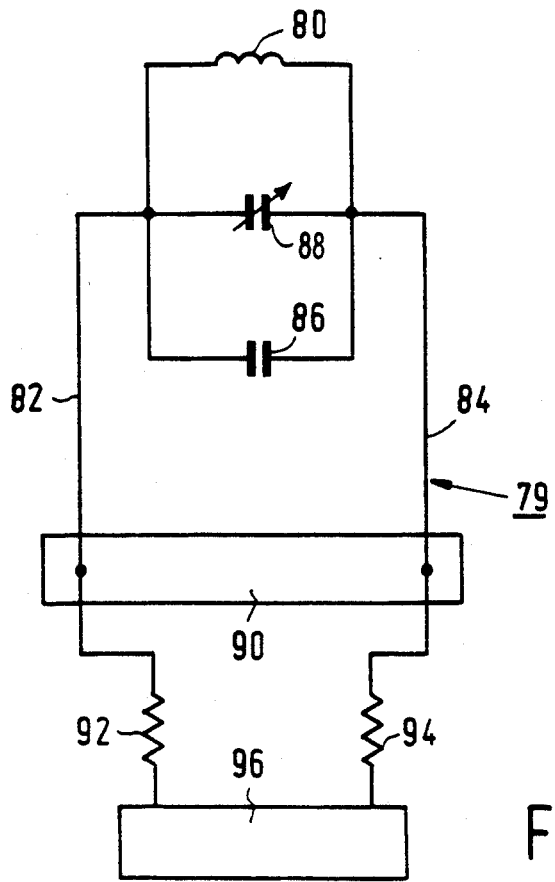
FIG.4

PLASMA GENERATOR

The invention relates to a plasma generator provided with an oscilator circuit having a tuned quarter-wave resonant system for generating a plasma discharge in an induction coil to be fed by the generator for heating an aerosol-containing material to be analyzed by means of a spectroscope.

Such a plasma generator is disclosed in EP 22404 which corresponds to U.S. Pat. No. 4,337,415. An apparatus described therein is equipped with a transmitter tube and an oscillator comprising a quarter-wave resonant system for maintaining a high-frequency resonant oscillation of for example approximately 40 to 60 MHz for feeding an induction coil in which a plasma is formed. The generator described there is provided, with a view to reducing its bulk and specifically for reducing the heater current supply, with only one single transmitter tube whose anode is inductively coupled to a first—the active—conductor of the quarter-wave resonant system, whilst a second—the passive—conductor of the resonant system is capacitively coupled to the anode of the transmitter tube.

Such a generator has the disadvantage that it has relatively large dimensions, particularly due to the relatively long length of the quarter-wave conductors, this length being for example for 40 MHz more than 1.5 meter. Also the mutual balancing of the two conductors of the quarter-wave resonant system relative to each other, particularly measured versus time, often leaves much to be desired for.

The invention has inter alia for its object to obviate these disadvantages and therefore according to the invention a plasma generator of the type defined in the opening paragraph, is characterized in that quarter-wave conductors are subdivided by folding into a plurality of sections and for mutual balancing at least one of these sections is capacitively coupled to a high-frequency generator component connected to ground potential.

As in an apparatus in accordance with the invention, the quarter-wave conductors are not located along a straight line, the generator can be of a much more compact structure and, by assigning additional functions to different conductor sections, balancing can be improved.

In a preferred embodiment the generator is again provided with one single-transmitter tube and a variable capacitance is added to the passive conductor of the quarter-wave resonant system whereby the symmetry between both conductors can always be corrected. More specifically, the passive conductor having a fixed capacitance and a variable capacitance is coupled to a central zero point of the conductor resonant system.

For an accurate setting, a preferred embodiment is provided with small incandescent lamps which can be adjusted to a minimal brightness for the balancing operation.

In a further preferred embodiment, a secondary resonant circuit provided with the induction coil inludes a variable capacitance so that the secondary circuit with induction coil and plasma discharge can be adapted in an optimum manner to the oscillator frequency. In a preferred embodiment the capacitance is formed by a fixed capacitor and a variable capacitor so that an accurate setting, necessary for analyzing materials of different natures can be realised.

In a further preferred embodiment, the induction coil is adjustable for height, preferably together with the entire secondary circuit without the desired frequency setting and balance being disturbed thereby. Thus, the position of, for example, an activated plasma induction coil can optimally be adapted thereby to a given position of a spectroscope. Limiting the height adjustment to a homogeneous path of the quarter-wave cable system already reduces tuning disburbances. Preferably, during height adjustment d.c. connection with central ground of the quarter-wave system is maintained by means of a sliding contact or a flexible connection. The setting for height can optionally be effected manually or in a motor or pneumatically driven manner.

With the object of cooling the plasma induction coil and a coil of the secondary resonant circuit, these components are preferably in the form of a hollow pipe. The pipe is coupled to a cooling liquid supply, preferably via electrically insulating tubes. The tubes are deformed during height adjustment so that they are of a deformable type, which can be obtained by either the choice of the material or by the geometry of the pipe.

Embodiments of the invention will now be described in greater detail with reference to the accompanying drawing. In the drawing:

FIG. 1 is a basic circuit diagram for a plasma generator of the invention,

FIG. 2 and FIG. 3, respectively, show an active and a passive quarter-wave cable intended for the plasma generator, FIG. 4 shows an example of a secondary oscillator circuit provided with an induction coil.

In a circuit diagram for an oscillator circuit as shown in FIG. 1, a transmitting tube 1, an active quarter-wave conductor 2, a passive quarter-wave conductor 4, a grid circuit 6 and a cathode circuit 8 are shown. The transmitting tube 1 is a radio-frequency tube, having an evacuated envelope 10, an anode 12, a grid 14 and a cathode 16. Here, the cathode has one side connected to ground and an other side radio-frequency decoupled from ground via a capacitor 18. The grid circuit 6 here comprises a self-inductance 22, a capacitance 24, a resistor 26 and optionally an ammeter 28 connected to ground potential. As stated in the foregoing, the resistor 26 may be arranged between the self-inductance 22 and the capacitor 24 but may alternatively, a further capacitor then being included, be arranged between the self-inductance 22 and the grid. The anode 12 is d.c. coupled to a first end 30 of the active quarter-wave conductor 2 of the quarter-wave resonant system. A capacitance 34 is coupled to ground at a first end 32 of the passive conductor 4. In accordance with the invention, the quarter-wave conductors are subdivided, in this case into two substantially equal portions 31, 33 and 35, 37, respectively. In addition to the capacitance 34, a capacitance 39 is included near the first end 32 of the passive conductor. Incandescent lamps 50 and 51 are arranged between an end 40 of the conductor portion 33 and a central point 42 and between an end 44 of the conductor portion 37 and the central point 42. By setting the incandescent lamps to the same, minimal brightness, the conductors are mutually balanced. To that end, one of the capacitances 34 or 39 is a variable capacitor. The ends 40 and 44 of the conductors are connected to a power supply terminal 59 via a capacitance 54, a self-inductance 56 and a capacitance 58.

FIG. 2 shows one of the quarter-wave conductors, more specifically the active conductor of the oscillator circuit in greater detail. A first end 30 is connected to the high-voltage anode 12 of a transmitting tube 1. A first conductor portion 31, in the shape of a metal strip, extends upwardly parallel along a grounded centre screen 60. An end 62 of the first conductor portion is connected via a metal strip 64 having an adapted geometry, to an end 66 of a second conductor portion 33 which extends downwardly at a facing side of the centre screen and in further respects is identical to the first portion. Using insulating spacers 68 the conductor strips are disposed at a fixed distance, for example 5 cms., from the centre screen. A capacitor 46 is included near the end 30 of the first conductor portion. This capacitor is preferably formed by a metal plate arranged in parallel with the conductor strip, between the conductor and the centre screen. To set the capacitance value, the spacing between the metal plate of the capacitor and the conductor strip can be varied. The variable capacitor 46 allows of a simple frequency matching of the quarter-wave conductor.

FIG. 3 shows, in a similar representation, an example of a passive conductor of the quarter-wave resonant system. Also here a first conductor portion 35 has a second end 70, which faces away from a first end, connected to a second end 74 of a second conductor portion 37 via a strip 72. A variable capacitor 39 and the fixed capacitor 34 are, for example, provided near the first end 32 of the first conductor portion 35. By varying the capacitor 39 and using the indicator incandescent lamps 50 and 51, the conductor portions 35, 37 and the conductor portions 31, 33 are balanced. Also in this case the strip-like conductor portions 35 and 37 are mounted by means of spacers 68 at a fixed distance of approximately 5 cms from a centre plate 60.

FIG. 4 is a schematic view of an example of a secondary oscillator circuit 79 having an induction coil 80 in which a plasma discharge can be generated. In addition, the circuit includes two conductors 82 and 84, a capacitance 86 and a second capacitance 88 which here is structured as a variable capacitor by means of which the secondary oscillator circuit can be matched to impedance variations of a differently charged induction coil. The two conductors 82 and 84 are interconnected via a conducting connection member 90.

In order to be cooled, the conductors of the induction coil and the conductors are in the form of a continuous hollow electrically conducting pipe which is connected to a cooling liquid supply 96 via insulating connecting means 92 and 94. Since in a generator according to the invention it is provided that the induction coil is adjustable for height, the connecting means 92 and 94 are capable of being deformed, for example by partly using flexible tubes or by the local design of the pipe, for example in the form of a helix or by partly designing them as accordion pipes. By means of a sliding contact or a different type of flexible conducting connections, the secondary oscillation circuit 79 remains electrically connected to the grounded centre screen during height readjustment. Consequently, also the induction coil 80 remains connected to ground via the secondary oscillation circuit. This is particularly advantageous in situations in which the induction coil, which is connected to high voltage, might induce electric spark discharges. Because of its structure, such a situation occurs, for example, particularly in mass spectrometry.

I claim:

1. A plasma generator provided with an oscillator circuit having a tuned quarter-wave resonant system for generating a plasma discharge in an induction coil to be fed by the generator for heating an aerosol-containing material to be analyzed by means of a spectroscope, characterized in that active and passive quarter-wave conductors are subdivided by folding into a plurality of sections and for mutual balancing the active quarter-wave conductor is capacitively coupled to a high-frequency generator connected to ground potential.

2. A plasma generator as claimed in claim 1 characterized in that the high frequency generator is provided with one single transmitter tube and in which an additional capacitance to ground is added to the passive conductor of the oscillation circuit, not directly connected to the transmitter tube, for setting conductor symmetry.

3. A plasma generator as claimed in claim 2, characterized in that the additional capacitance to ground includes a variable capacitance and a fixed capacitance connected to the passive conductor.

4. A plasma generator as claimed in claim 1, characterized in that symmetrically arranged incandescent lamps are added to both conductors of the oscillator circuit for the purpose of mutual balancing.

5. A plasma generator as claimed in claim 1, characterized in that a variable capacitance for frequency match to impedance variations of the induction coil is added to a circuit incorporating the induction coil.

6. A plasma generator as claimed in claim 5, characterized in that the variable capacitance of the circuit incorporating the induction coil is formed by a fixed capacitor and a variable capacitor.

7. A plasma generator as claimed in claim 1, characterized in that a circuit containing the induction coil is connected to ground via a flexible electric connection.

8. A plasma generator as claimed in claim 1, characterized in that a resonant circuit with the induction coil is in the form of a hollow electrically conducting pipe which can be connected to a cooling liquid supply.

9. A plasma generator as claimed in claim 8, characterized in that the connection to the cooling liquid supply incorporates deformable electrically insulating lines.

* * * * *